(12) United States Patent
Jeddeloh

(10) Patent No.: US 6,421,813 B1
(45) Date of Patent: Jul. 16, 2002

(54) METHOD AND APPARATUS FOR PROVIDING VISIBILITY AND CONTROL OVER COMPONENTS WITHIN A PROGRAMMABLE LOGIC CIRCUIT FOR EMULATION PURPOSES

(75) Inventor: Joseph M. Jeddeloh, Minneapolis, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/417,964

(22) Filed: Oct. 13, 1999

(51) Int. Cl.[7] .............................................. G06F 17/50
(52) U.S. Cl. ......................................................... 716/5
(58) Field of Search .............................. 716/4, 17, 5, 2

(56) References Cited

U.S. PATENT DOCUMENTS 5,754,759 A * 5/1998 Charke ........................ 716/17
6,263,396 B1 * 7/2001 Cottle ........................... 716/4

* cited by examiner

Primary Examiner—Matthew Smith
Assistant Examiner—Thuan Do
(74) Attorney, Agent, or Firm—Park, Vaughan & Fleming LLP

(57) ABSTRACT

One embodiment of the present invention provides an apparatus that selectively provides visibility and control over components within a programmable logic circuit during the process of emulating a logic circuit. The apparatus includes an input mechanism that receives a specifier for a memory element to be accessed during emulation of the logic circuit. This memory element resides within a design specifying logic to be programmed into the programmable logic circuit. The apparatus also includes a design modification mechanism that modifies the design so that the memory element is accessible through I/O pins on the programs logic circuit, and a programming mechanism that programs the modified design into the programmable logic circuit. The apparatus additionally includes a testing mechanism that tests the programmable logic circuit and accesses the memory element during the testing. In one embodiment of the present invention, the memory element is a register. In one embodiment of the present invention, the programmable logic circuit includes a field programmable gate array (FPGA). In one embodiment of the present invention, the design modification mechanism is configured to map the memory element into an address space of a bus that is coupled to the I/O pins so that the memory element can be accessed by a testing program. In one embodiment of the present invention, the testing mechanism is configured to access the memory element by reading a value from the memory element or by writing a value into the memory element.

24 Claims, 3 Drawing Sheets

METHOD AND APPARATUS FOR PROVIDING VISIBILITY AND CONTROL OVER COMPONENTS WITHIN A PROGRAMMABLE LOGIC CIRCUIT FOR EMULATION PURPOSES

BACKGROUND

1. Field of the Invention

The present invention relates to testing during the process of developing of computer system components. More specifically, the present invention relates to a method and an apparatus that selectively provides visibility and control over components within a programmable logic circuit for emulation purposes.

2. Related Art

Because of recent increases in speed and gate count for field programmable gate arrays (FPGAs), it is presently possible to move large cores from custom application specific integrated circuits (ASICs) into FPGAs. This potentially provides a powerful tool for debugging logic. The register transfer level (RTL) code for a large core from an ASIC can be loaded into a FPGA and can be tested within an operating computer system.

Unfortunately, this technique does not provide the same visibility and control that is present in a logic simulation program. Logic simulation programs typically allow different signals to be monitored and/or controlled during a simulation, which can be extremely useful in determining the cause of an error.

One disadvantage of logic simulation programs is that they are extremely slow. They operate many hundreds or thousands of times slower than the actual speed of the logic that is being simulated. Hence, logic simulation programs can only be used for a limited number of test cases. Otherwise, the simulation time becomes prohibitively long. Furthermore, logic simulation cannot be used to test a design within a computer system that is operating at full speed. Hence, it is not feasible to test real-time interactions with other components in a computer system using logic simulation.

What is needed is a system that provides visibility and control over memory elements within a design that is loaded into a programmable logic circuit during emulation of a logic circuit.

SUMMARY

One embodiment of the present invention provides a system for selectively providing visibility and control over components within a programmable logic circuit during the process of emulating a logic circuit. The system operates by receiving a specifier for a memory element to be accessed during emulation of the logic circuit. This memory element resides within a design specifying logic to be programmed into the programmable logic circuit. Upon receiving the specifier, the system modifies the design so that the memory element is accessible through I/O pins on the programmable logic circuit, and then programs the modified design into the programmable logic circuit. Next, the design is tested by operating the programmable logic circuit and accessing the memory element.

In one embodiment of the present invention, the memory element includes a register.

In one embodiment of the present invention, the programmable logic circuit includes a field programmable gate array (FPGA).

In one embodiment of the present invention, modifying the design includes mapping the memory element into an address space of a bus that is coupled to the I/O pins. This allows the memory element to be accessed by a testing program.

In one embodiment of the present invention, accessing the memory element includes reading a value from the memory element and displaying the value.

In one embodiment of the present invention, accessing the memory element includes writing a value into the memory element.

In one embodiment of the present invention, the system migrates the design to an application specific integrated circuit (ASIC) if the testing indicates that the design functions properly within the programmable logic circuit.

In one embodiment of the present invention, the system includes receiving a specifier for a breakpoint condition within the programmable logic circuit. This specifier indicates when execution of the programmable logic circuit is to be stopped. In response to this break point specifier, the system modifies the design so that the programmable logic circuit is stopped when the breakpoint condition occurs. This may be accomplished by modifying the design so that a clock signal stops when the breakpoint condition occurs, or by modifying the design so that a state machine within the programmable logic circuit stops changing states when the breakpoint condition occurs.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital video discs), and computer instruction signals embodied in a transmission medium (with or without a carrier wave upon which the signals are modulated). For example, the transmission medium may include a communications network, such as the Internet.

Definitions: Specifier—That which names or states explicitly or in detail. In the context of the instant application, a specifier is an item;that names a memory element, a breakpoint condition, or the like.

Computer System

Figure 1:
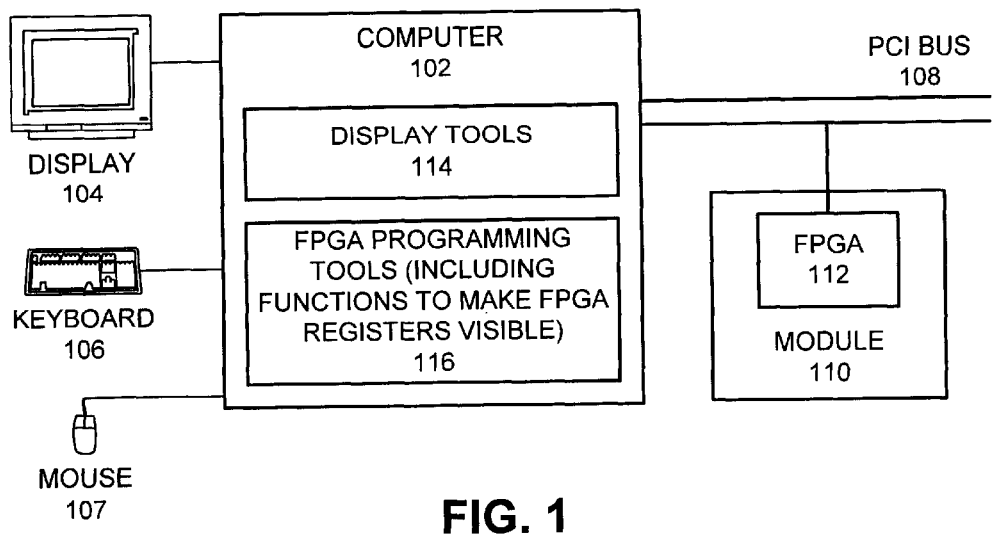
FIG. 1 illustrates a computer system in accordance with an embodiment of the present invention.

FIG. 1 illustrates a computer system in accordance with an embodiment of the present invention. The computer system illustrated in FIG. 1 includes computer 102, which is coupled to display 104, keyboard 106 and mouse 107. Computer 102 is also coupled to module 110 through peripheral component interconnect (PCI) bus 108.

Computer 102 can include any type of computer system built around a general or special purpose processor, including, but not limited to, a microprocessor, a mainframe computer, a digital signal processor, a graphics processor and a device controller.

Display 104 can include any type of display for viewing output from computer 102, including, but not limited to, a cathode ray tube display, a flat panel display and a touch-sensitive display.

Keyboard 106 and mouse 107 can include any type of device for inputting data and/or commands into computer 102.

Module 110 contains field programmable gate array (FPGA) 112. FPGA 112 can include any type of device that can be repeatedly programmed to implement different logic functions. This includes, but is not limited to a flash memory, a gate array and an EEPROM (electrically erasable programmable read only memory). In one embodiment of the present invention, FPGA 112 includes a plurality of FPGA devices.

Computer 102 includes a number of programs for programming and testing the operation of a circuit that is implemented in FPGA 112. This includes display tools 114 and FPGA programming tools 116. Display tools 114 include circuit development tools that allow a user of computer 102 to test circuitry within FPGA 112, and to monitor the state of circuitry within FPGA 112. FPGA programming tools 116 include software for programming logic functions into FPGA 112.

During operation, the computer system illustrated in FIG. 1 generally operates as follows. A user interacts with computer 102 through keyboard 106, mouse 107 and display 104. The user tests a design by loading the design into FPGA 112. In doing so, the user can specify particular memory elements within FPGA 112 to monitor or set. Next, the design is modified so that the specified memory elements are accessible through PCI bus 108. This allows display tools 114 to manipulate and monitor the memory elements within FPGA 112 for testing purposes.

Testing a Design within a FPGA

Figure 2:
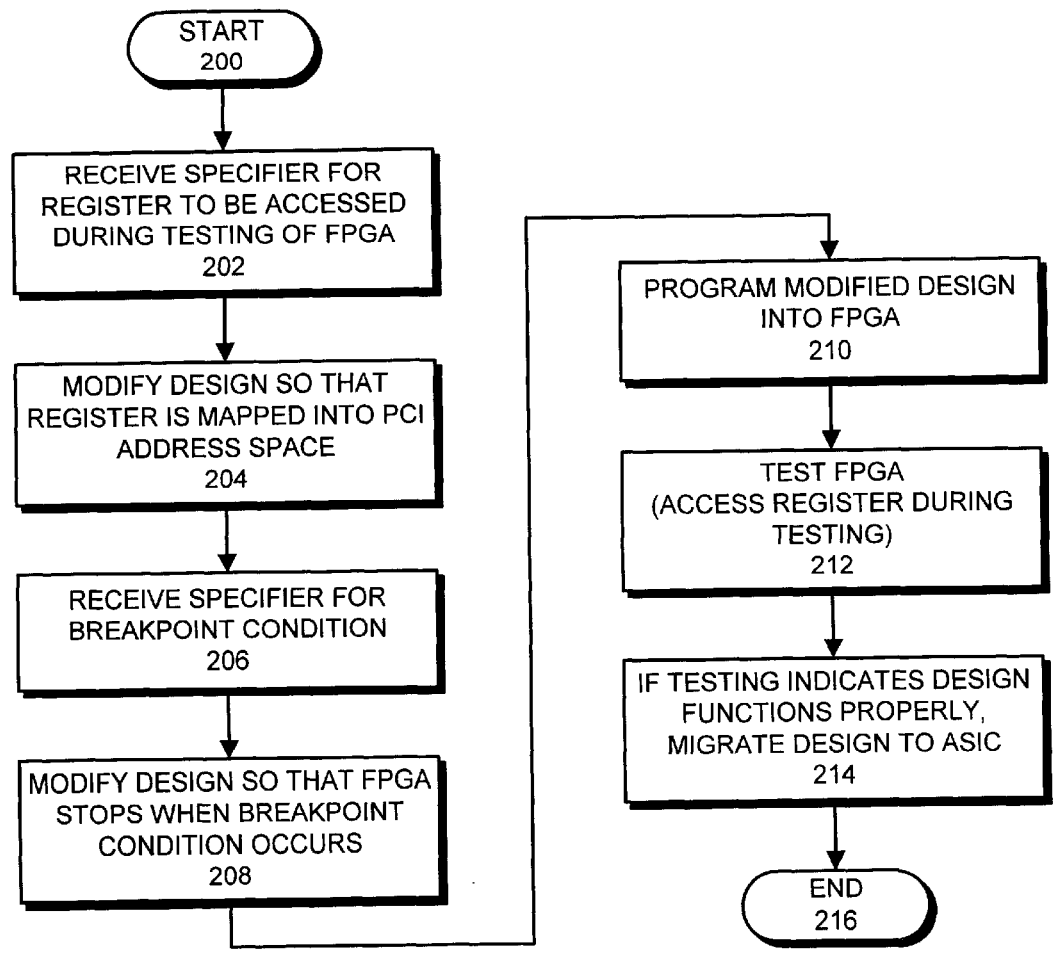
FIG. 2 is a flow chart illustrating the process of testing a design within a FPGA in accordance with an embodiment of the present invention.

FIG. 2 is a flow chart illustrating the process of testing a design within FPGA 112 in accordance with an embodiment of the present invention. The system starts by receiving a specifier for a register (or other memory element) within the design that is to be accessed during testing of FPGA 112 (step 202). This access may involve either a read operation to read the contents of the register, or a write operation to write a value to the register. In one embodiment of the present invention, the register specifier is produced by display tools 114 in response to a user selecting a register to be monitored or manipulated during the testing process.

In response to receiving the register specifier, the system modifies the design so that the specified register is mapped into the address space of PCI bus 108 (step 204). This can be accomplished by using the circuitry disclosed with reference to FIGS. 3 and 4 below. By mapping the selected register into the PCI address space, the selected register can be read from and/or written to by a computer program during testing.

The system may also receive a specifier for a breakpoint condition (step 206). In response to receiving the specifier for the breakpoint condition, the system modifies the design so that FPGA 112 stops changing states when the break point condition occurs (step 208). This allows the internal state of FPGA 112 to be examined at a critical point in the operation of FPGA 112 for debugging purposes. In one embodiment of the present invention, the breakpoint condition specifier is produced by display tools 114 in response to a user selecting a register to be monitored or manipulated during the testing process. Note that the breakpoint condition may specify that FPGA 112 should stop upon reaching a particular state within the FPGA. Alternatively, the breakpoint may specify that FPGA 112 should stop when certain signal lines assume pre-specified values.

Next, the system programs the modified design into FPGA 112 (step 210). After the modified design is programmed into FPGA 112, FPGA 112 is tested by operating FPGA 112 until it reaches the breakpoint. Upon reaching the breakpoint, the system reads the values of various registers within FPGA 112 (step 212).

Finally, if the testing indicates that the design functions properly, the design may be migrated to an application specific integrated circuit (ASIC) (step 214). Alternatively, the design can be implemented in FPGA 112 after reversing the modifications to the design that were made in steps 204 and 208.

Circuitry for Reading Registers within a FPGA

Figure 3:
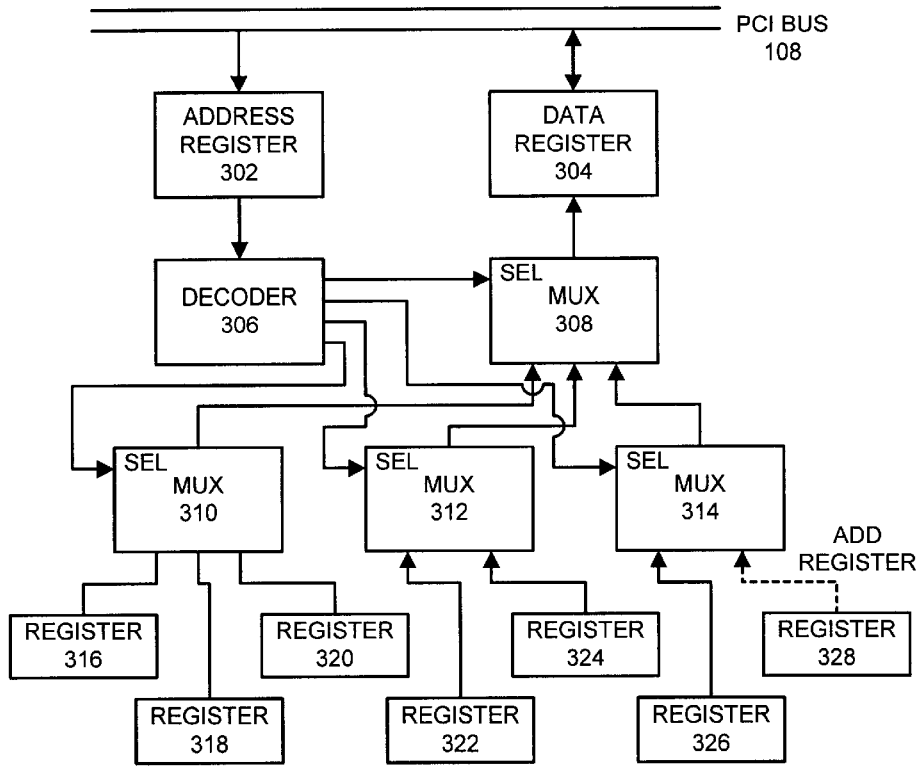
FIG. 3 illustrates circuitry for reading registers within a FPGA in accordance with an embodiment of the present invention.

FIG. 3 illustrates circuitry for reading registers within FPGA 112 in accordance with an embodiment of the present invention. This circuitry provides an interface between PCI bus 108 (from FIG. 1) and registers (or other memory elements) within FPGA 112. A memory-mapped PCI address for the register to be read feeds into address register 302. Address register 302 feeds into decoder 306, which converts the value from address register 302 into select signals for multiplexers 308, 310, 312 and 314. These select signals select one of registers 316, 318, 320, 322, 324, 316 and 318 to be gated into data register 304. Finally, the value in data register 304 is returned across PCI bus 108 to complete the read operation.

Note that mapping a register into the PCI address space entails coupling the register to one of multiplexers 310, 312 or 314. For example, register 328 can be attached to multiplexer 314 to provide a pathway between register 328 and PCI bus 108 (dashed line). Note that FIG. 3 does not show the standard bus interface logic to perform handshaking with PCI bus 108.

Circuitry for Writing Registers within a FPGA

Figure 4:
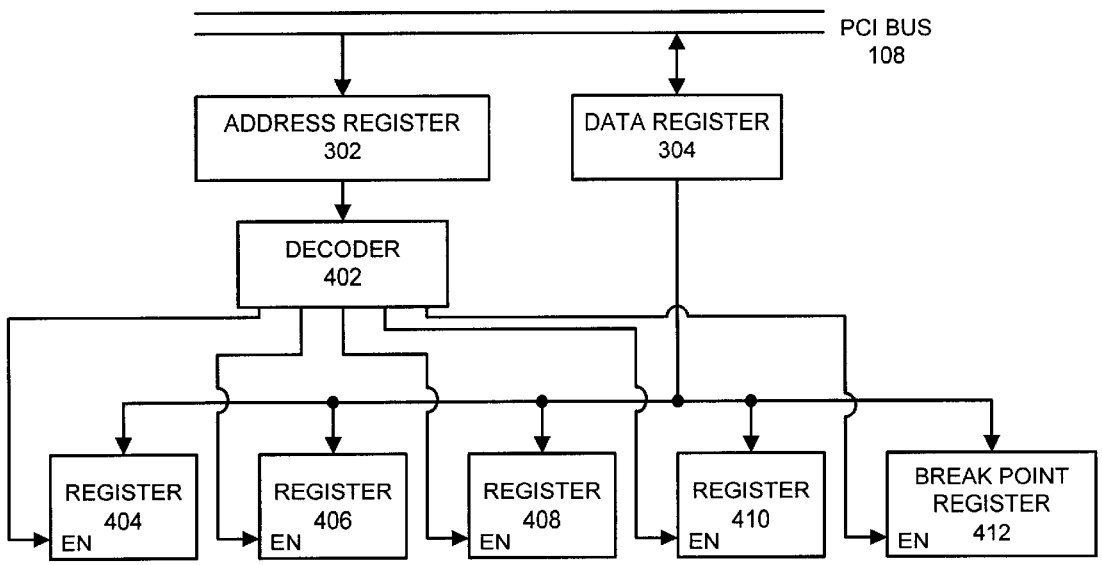
FIG. 4 illustrates circuitry for writing to registers within a FPGA in accordance with an embodiment of the present invention.

FIG. 4 illustrates circuitry for writing to registers within FPGA 112 in accordance with an embodiment of the present invention. This circuitry makes use of address register 302 and data register 304 that were described previously with reference to FIG. 3. A memory-mapped PCI address for the register to be written to feeds into address register 302. Address register 302 feeds into decoder 402, which converts the value stored in address register 302 into enable signals for registers 404, 406, 408, 410 and 412. At the same time, a value to be written into the selected register feeds into data register 304 from PCI bus 108. The contents of data register 304 feeds into each of registers 404, 406,408, 410 and 412. If one of registers 404, 406, 408 410 and 412 is enabled, the contents of data register 304 will be loaded into it.

Note that register 412 is a breakpoint register, which contains a value specifying a state in which a state machine within FPGA 112 stops advancing for so that circuitry within FPGA 112 can be monitored for diagnostic purposes. This is described in more detail below with reference to FIG. 5.

Circuitry for Setting a Breakpoint

Figure 5:
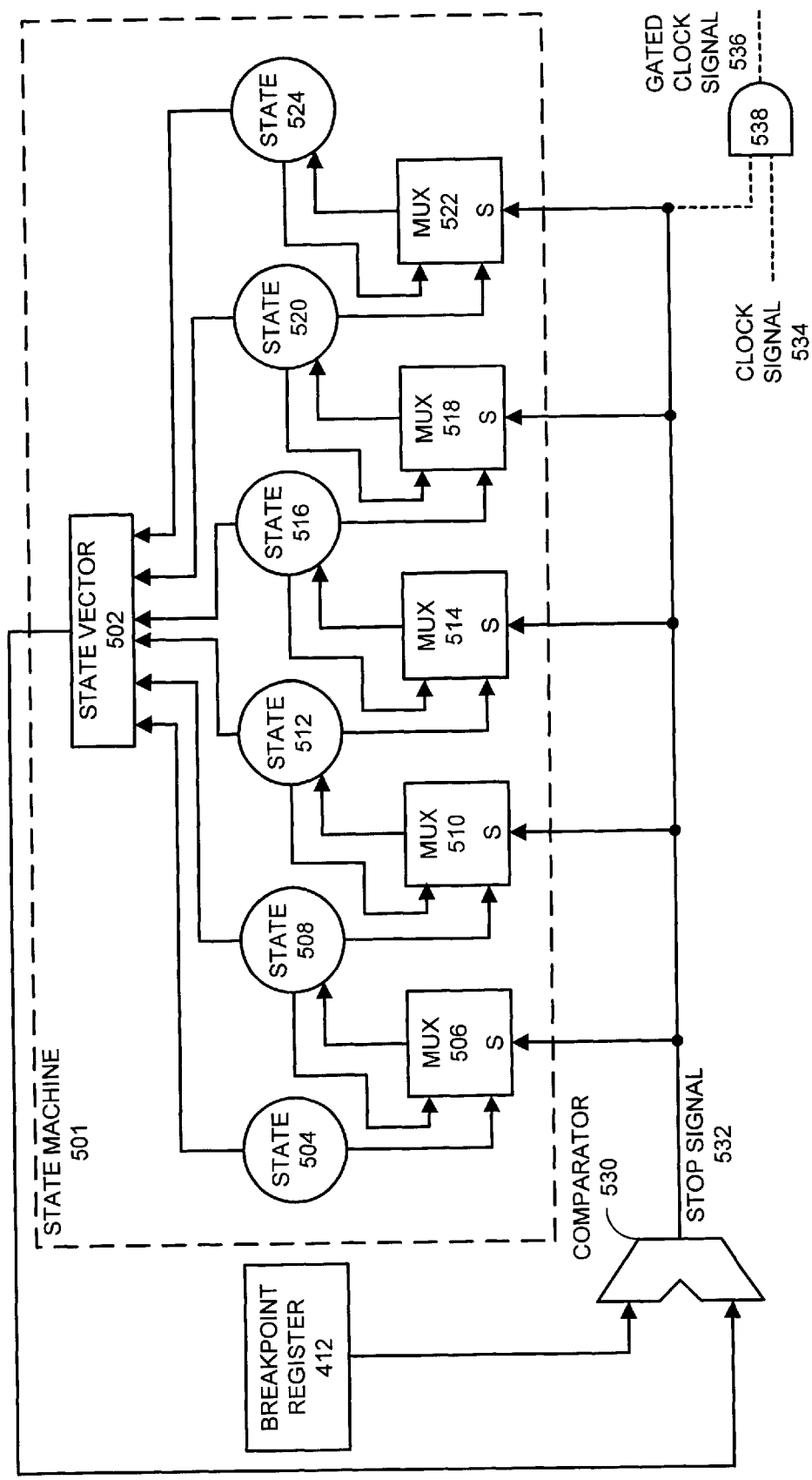
FIG. 5 illustrates circuitry that sets a breakpoint to stop execution of the FPGA upon the occurrence of a breakpoint condition in accordance with an embodiment of the present invention.

FIG. 5 illustrates circuitry that sets a breakpoint to stop execution of FPGA 112 upon the occurrence of a breakpoint condition in accordance with an embodiment of the present invention. FIG. 5 includes state machine 501, which controls the actions of circuitry with FPGA 112. State machine 501 includes state variables 504, 508, 512, 516, 520 and 524, which are organized as a shift register that shuffles a one-hot state bit through state variables 504, 508, 512, 516, 520 and 524. A number of multiplexers 506, 510, 514, 518 and 522 are interposed between state variables 504, 508, 512, 516, 520 and 524, so that asserting stop signal 532 causes the one-hot state bit to stop cycling through state variables 504, 508, 512, 516, 520 and 524. When stop signal 532 is asserted, the one-hot state bit remains stationary in one of state variables 504, 508, 512, 516, 520 and 524.

The values contained in state variables 504, 508, 512, 516, 520 and 524 form state vector 502, which feeds into an input of comparator 530. Note that state vector 502 may contain memory elements to hold the values from state variables 504, 508, 512, 516, 520 and 524. Alternatively, state vector 502 may include conductors that pass the values of state variables 504, 508, 512, 516, 520 and 524 straight through.

Comparator 530 compares the value stored in breakpoint register 412 with the value of state vector 502. If the values match, comparator 530 produces stop signal 532, which causes state machine 501 to stop advancing.

Alternatively, a clock signal within FPGA 112 can be interrupted. Stop signal 532 can feed into an input of AND gate 538. The other input of AND gate 538 receives clock signal 534 to produce gated clock signal 536 at the output of AND gate 538. This causes gated clock signal 536 to stop changing when stop signal 532 is asserted.

The foregoing descriptions of embodiments of the invention have been presented for purposes of illustration and description only. They are not intended to be exhaustive or to limit the invention to the forms disclosed. Accordingly, many modifications and variations will be apparent to practitioners skilled in the art. Additionally, the above disclosure is not intended to limit the invention. The scope of the invention is defined by the appended claims.

What is claimed is:

1. A method for selectively providing visibility and control over components within a programmable logic circuit during testing of the programmable logic circuit, comprising:

receiving a specifier for a memory element to be accessed during testing of the programmable logic circuit, the memory element residing within a design specifying logic to be programmed into the programmable logic circuit, modifying the design so that the memory element is accessible through I/O pins on the programmable logic circuit;

receiving a specifier for a breakpoint condition within the programmable logic circuit, the specifier indicating when execution of the programmable logic circuit is to be stopped during the testing;

modifying the design so that the programmable logic circuit is stopped when the breakpoint condition occurs during the testing;

programming the modified design into the programmable logic circuit;

testing the programmable logic circuit by operating the programmable logic circuit, and accessing the memory element during the testing.

2. The method of claim 1, wherein receiving the specifier for the memory element includes receiving a specifier for a register.

3. The method of claim 1, wherein testing the programmable logic circuit includes testing a field programmable gate array (FPGA).

4. The method of claim 1, wherein modifying the design includes mapping the memory element into an address space of a bus that is coupled to the I/O pins so that the memory element can be accessed by a testing program.

5. The method of claim 1, wherein accessing the memory element includes reading a value from the memory element.

6. The method of claim 5, further comprising displaying a value read from the memory element.

7. The method of claim 1, wherein accessing the memory element includes writing a value into the memory element.

8. The method of claim I, further comprising if the testing indicates that the design functions properly within the programmable logic circuit, migrating the design to an application specific integrated circuit (ASIC).

9. The method of claim 1, wherein modifying the design so that the programmable logic circuit is stopped when the breakpoint condition occurs, includes modifying the design so that a clock signal stops when the breakpoint condition occurs.

10. The method of claim 1, wherein modifying the design so that the programmable logic circuit is stopped when the breakpoint condition occurs, includes modifying the design so that a state machine within the programmable logic circuit stops changing states when the breakpoint condition occurs.

11. The method of claim 1, wherein the steps of receiving a specifier, modifying the design, and programming the modified design are performed by a computer program.

12. A computer-readable storage medium storing instructions that when executed by the computer cause the computer to perform a method for selectively providing visibility and control over components within a programmable logic circuit during testing of the programmable logic circuit, comprising:

receiving a specifier for a memory element to be accessed during testing of the programmable logic circuit, the memory element residing within a design specifying logic to be programmed into the programmable logic circuit;

modifying the design so that the memory element is accessible through I/O pins on the programmable logic circuit;

receiving a specifier for a breakpoint condition within the programmable logic circuit, the specifier indicating when execution of the programmable logic circuit is to be stopped during the testing; modifying the design so that the programmable logic circuit is stopped when the breakpoint condition occurs during the testing;

programming the modified design into the programmable logic circuit;

testing the programmable logic circuit by operating the programmable logic circuit; and accessing the memory element during the testing.

13. An apparatus that selectively provides visibility and control over components within a programmable logic circuit during testing of the programmable logic circuit, comprising:

an input mechanism that receives a specifier for a memory element to be accessed during testing of the programmable logic circuit, the memory element residing within a design specifying logic to be programmed into the programmable logic circuit;

wherein the input mechanism is further configured to receive a specifier for a breakpoint condition within the programmable logic circuit, the specifier indicating when execution of the programmable logic circuit is to be stopped during the testing;

a design modification mechanism that modifies the design so that the memory element is accessible through I/O pins on the programmable logic circuit;

wherein the design modification mechanism is further configured to modify the design so that the programmable logic circuit stops when the breakpoint condition occurs during the testing;

a programming mechanism that programs the modified design into the programmable logic circuit; and a testing mechanism that,
operates the programmable logic circuit, and
accesses the memory element during the testing.

14. The apparatus of claim 13, wherein the memory element is a register within the design.

15. The apparatus of claim 13, wherein the programmable logic circuit includes a field programmable gate array (FPGA).

16. The apparatus of claim 13, wherein the design modification mechanism is configured to map the memory element into an address space of a bus that is coupled to the I/O pins so that the memory element can be accessed by a testing program.

17. The apparatus of claim 13, wherein the testing mechanism is configured to access the memory element by reading a value from the memory element.

18. The apparatus of claim 17, wherein the testing mechanism is further configured to display a value read from the memory element.

19. The apparatus of claim 13, wherein the testing mechanism is configured to access the memory element by writing a value into the memory element.

20. The apparatus of claim 13, further comprising a design migration mechanism that is configured to migrate the design to an application specific integrated circuit (ASIC) if the testing mechanism indicates that the design functions properly within the programmable logic circuit.

21. The apparatus of claim 13, wherein the design modification mechanism is configured to modify the design so that a clock signal stops when the breakpoint condition occurs.

22. The apparatus of claim 13, wherein the design modification mechanism is configured to modify the design so that a state machine within the programmable logic circuit stops changing states when the breakpoint condition occurs.

23. The apparatus of claim 13, wherein the input mechanism, the design modification mechanism and the programming mechanism are implemented within computer program.

24. A computer system that selectively provides visibility and control over components within a programmable logic circuit during testing of the programmable logic circuit, comprising:

a processor;

a memory;

an input mechanism that receives a specifier for a memory element to be accessed during testing of the programmable logic circuit, the memory element residing within a design specifying logic to be programmed into the programmable logic circuit;

wherein the input mechanism is further configured to receive a specifier for a breakpoint condition within the programmable logic circuit, the specifier indicating when execution of the programmable logic circuit is to be stopped during the testing;

a design modification mechanism that modifies the design so that the memory element is accessible through I/O pins on the programmable logic circuit;

wherein the design modification mechanism is further configured to modify the design so that the programmable logic circuit stops when the breakpoint condition occurs during the testing;

a programming mechanism that programs the modified design into the programmable logic circuit; and a testing mechanism that,
operates the programmable logic circuit, and
accesses the memory element during the testing;
wherein the input mechanism, the design modification mechanism, the programming mechanism and the testing mechanism are implemented by a computer program stored within the memory and executed by the processor.

* * * * *